United States Patent
Bang et al.

(10) Patent No.: US 9,905,309 B2
(45) Date of Patent: Feb. 27, 2018

(54) ONE-TIME PROGRAMMABLE MEMORY DEVICE HAVING ACCESS CIRCUIT

(71) Applicant: Samsung Electronics Co., Ltd., Suwon-si, Gyeonggi-do (KR)

(72) Inventors: Hoon Jin Bang, Yongin-si (KR); Sang Seok Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/393,838

(22) Filed: Dec. 29, 2016

(65) Prior Publication Data

US 2017/0287570 A1 Oct. 5, 2017

(30) Foreign Application Priority Data

Apr. 5, 2016 (KR) ........................ 10-2016-0041812

(51) Int. Cl.
  *G11C 17/00* (2006.01)
  *G11C 17/18* (2006.01)
  *G11C 17/16* (2006.01)
(52) U.S. Cl.
  CPC .............. *G11C 17/18* (2013.01); *G11C 17/16* (2013.01)
(58) Field of Classification Search
  CPC ................................ G11C 17/18; G11C 17/16
  USPC .......................................................... 365/96
  See application file for complete search history.

(56) References Cited

U.S. PATENT DOCUMENTS

| | | | |
|---|---|---|---|
| 7,227,802 B2 | 6/2007 | Jung et al. | |
| 7,280,425 B2 | 10/2007 | Keshavarzi et al. | |
| 7,511,982 B2 | 3/2009 | Kujanowicz et al. | |
| 8,120,974 B2 | 2/2012 | Matsufuji | |
| 8,154,941 B2 | 4/2012 | Ito | |
| 8,259,528 B2 | 9/2012 | Kodama et al. | |
| 8,817,518 B2 | 8/2014 | Yoon et al. | |
| 2007/0165441 A1* | 7/2007 | Kurjanowicz | G11C 17/16 365/96 |
| 2013/0033921 A1* | 2/2013 | Tsuda | G11C 7/24 365/148 |
| 2013/0322150 A1* | 12/2013 | Kim | G11C 17/16 365/104 |
| 2014/0241066 A1 | 8/2014 | Grant et al. | |
| 2014/0269135 A1 | 9/2014 | Chung | |

FOREIGN PATENT DOCUMENTS

| | | |
|---|---|---|
| JP | 2006338766 | 12/2006 |
| KR | 0940198 | 12/2009 |
| KR | 20100082046 | 7/2010 |
| KR | 1104643 | 5/2011 |

* cited by examiner

*Primary Examiner* — Huan Hoang
(74) *Attorney, Agent, or Firm* — Myers Bigel, P.A.

(57) ABSTRACT

A one-time programmable (OTP) memory device includes an OTP memory cell array comprising a plurality of dummy cells and a plurality of main cell groups of main cells and an access circuit configured to write data to at least two of the cells simultaneously. The arrangement of the dummy cells and the main cell groups may allow for the reliable writing of multi-bit data to the memory array. Each of the main cell groups may include a plurality of main cells which are connected to word lines, respectively, and to bit lines, respectively. Each of the main cells may be writable and each of the dummy cells may be unwritable. Each of the main cells may include a contact layer, and the dummy cells might not include the contact layer. A supply voltage may be applied to the OTP memory cell array through the contact layer.

17 Claims, 19 Drawing Sheets

ONE-TIME PROGRAMMABLE MEMORY DEVICE HAVING ACCESS CIRCUIT

CROSS-REFERENCE TO RELATED APPLICATIONS

This application claims priority under 35 U.S.C. § 119(a) from Korean Patent Application No. 10-2016-0041812 filed on Apr. 5, 2016, the disclosure of which is hereby incorporated by reference in its entirety.

BACKGROUND

Aspects of the present disclosure relate to a one-time programmable (OTP) memory device, and more particularly, to an OTP memory device that can improve write performance.

OTP memory can be used in a micro controller unit (MCU), a power management integrated circuit (PMIC), a display driver IC (DDI), or a complementary metal-oxide semiconductor (CMOS) image sensor. OTP memory can be programmed by breaking the connection of a fuse or creating the connection of an antifuse in a circuit of the OTP memory.

Once programming is performed on OTP memory, it is usually irreversible. Accordingly, programming of the OTP memory is performed taking its end use into account after manufacturing of a memory device. A resistive fuse element that can be implemented in OTP memory may be opened or shorted by applying a current of at least a predetermined value. An antifuse usable in the OTP memory may be implemented by a thin layer including a non-conductive material, e.g., silicon dioxide, between two conductor layers or two terminals. The two conductors may be shorted or become a conductive path with a low resistance due to a voltage of at least a predetermined value.

When OTP memory is included in a semiconductor memory device, the OTP memory may store diverse data, which may be used during the operation of the semiconductor memory device. The OTP memory may be implemented in a form of an array including a plurality of fuses or anti-fuses in order to efficiently store the diverse data.

SUMMARY

According to some aspects of the present disclosure, there is provided a one-time programmable (OTP) memory device including an OTP memory cell array. The OTP memory cell array may include a plurality of dummy cells and a plurality of main cell groups, each of the main cell groups may include a plurality of main cells, and an access circuit configured to write data to at least two of the main cells simultaneously. Each of the plurality of main cells are connected to a respective word line of a plurality of word lines, and to a respective bit line of a plurality of bit lines. Each of the main cells may be writable and each of the dummy cells may be unwritable.

According to other aspects of the present disclosure, there is provided an OTP memory device including an OTP memory cell array comprising a plurality of OTP memory cells each of which is connected to one of a plurality of word lines and one of a plurality of bit lines and an access circuit configured to sequentially write a plurality of data to at least two of the OTP memory cells during a write time. The write time may be duration during which one of the word lines is activated.

According to other aspects described herein, a one-time programmable (OTP) memory device may be provided. The OTP memory device may include an OTP memory cell array which may include a first main cell group and a second main cell group. The first main cell group and the second main cell group may include each at least one main cell, which may be respectively connected to one of a plurality of word lines and one of a plurality of bit lines. Also included in the OTP memory device may be an access circuit configured to simultaneously write a plurality of data to at least two of the main cells during a write time. The access circuit may be configured to activate at least two word lines of the plurality of word lines and select at least two of the bit lines of the plurality of bit lines.

BRIEF DESCRIPTION OF THE DRAWINGS

The above and other features and advantages of the present disclosure will become more apparent by describing in detail exemplary embodiments thereof with reference to the attached drawings in which.

DETAILED DESCRIPTION

Figure 1A:
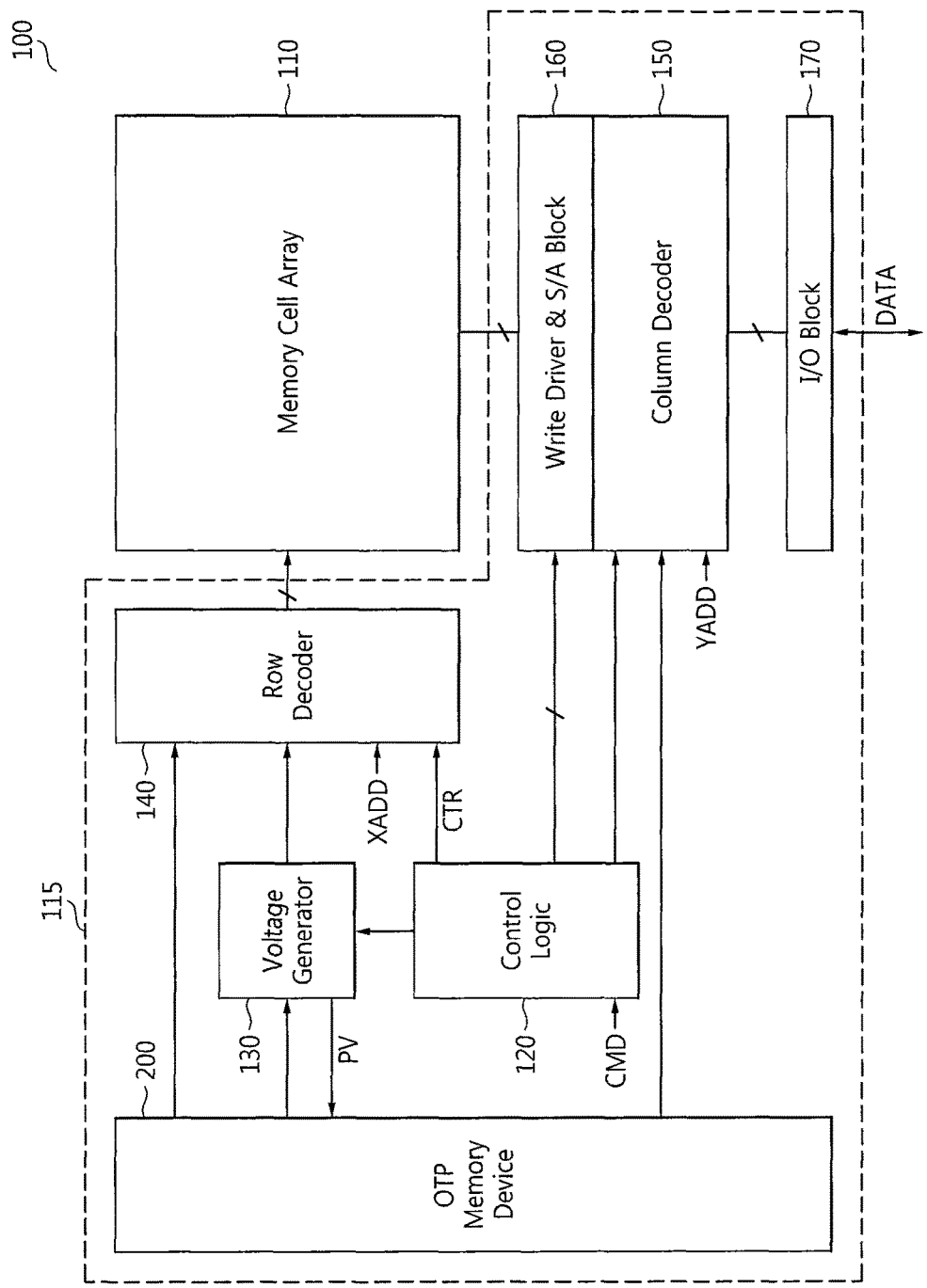
FIG. 1A is a block diagram of a semiconductor memory device according to some aspects of the present disclosure.

The present disclosure now will be described more fully hereinafter with reference to the accompanying drawings, in which embodiments of the present disclosure are shown. The inventive concepts described herein may, however, be embodied in many different forms and should not be construed as limited to the embodiments set forth herein. Rather, these embodiments are provided so that this disclosure will be thorough and complete, and will fully convey the scope of the inventive concepts to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

FIG. 1A is a block diagram of a semiconductor memory device 100 according to some aspects of the present disclosure. Although a one-time programmable (OTP) memory device 200 is included in the semiconductor memory device 100 in the embodiments illustrated in FIG. 1A, the present disclosure is not restricted to the current embodiments. For example, the OTP memory device 200 may be included in an application processor or an image signal processor in other embodiments. The semiconductor memory device 100 may include a memory cell array 110 and a peripheral circuit 115.

The semiconductor memory device 100 may be implemented as a volatile or non-volatile memory device. The volatile memory device may include dynamic random access memory (DRAM), static RAM (SRAM), thyristor RAM (T-RAM), zero capacitor RAM (Z-RAM), or twin transistor RAM (TTRAM). The non-volatile memory device may include electrically erasable programmable read-only memory (EEPROM), flash memory, magnetic random access memory (MRAM), spin-transfer torque MRAM, conductive bridging RAM (CBRAM), ferroelectric RAM (FeRAM), phase-change RAM (PRAM), resistive RAM (RRAM), nanotube RRAM, polymer RAM (PoRAM), nano floating gate memory (NFGM), holographic memory, molecular electronic memory device, and/or insulator resistance change memory.

The memory cell array 110 may include a plurality of memory cells storing data. The memory cell array 110 may be implemented in a two- or three-dimensional structure.

The memory cell array 110 may include a three-dimensional memory cell array. The three-dimensional memory cell array may be monolithically formed at one or more physical levels in an array of memory cells having an active region disposed on or above a silicon substrate and may include a circuit involved in the operation of the memory cells. The circuit may be formed in, on or above the silicon substrate. The term "monolithic" means that layers at each level in an array are directly deposited on layers at an underlying level in the array. The three-dimensional memory cell array may include a vertical NAND string which is vertically oriented so that at least one memory cell is placed on or above another memory cell. The at least one memory cell may include a charge trap layer.

The peripheral circuit 115 may access the memory cell array 110 to perform a data access operation, e.g., a read operation or a write operation, according to a set of commands CMD, XADD, and YADD received from an external device, e.g., a memory controller (not shown). In other embodiments, the peripheral circuit 115 may access the memory cell array 110 to perform a program operation (or a write operation), a read operation, or an erase operation. The peripheral circuit 115 may include a control logic 120, a voltage generator 130, a row decoder 140, a column decoder 150, a write driver and sense amplifier (S/A) block 160, an input/output (I/O) block 170, and the OTP memory device 200.

The control logic 120 may control the overall operation of the peripheral circuit 115 in response to a command (e.g., CMD) included in a command set. The voltage generator 130 may generate a voltage for the data access operation according to a control code generated by the control logic 120. Although the voltage generated by the voltage generator 130 is applied to the row decoder 140 in FIG. 1A, the present disclosure is not limited thereto (e.g., voltage generated by the voltage generator 130 may be applied to the column decoder 150 and/or other components of the peripheral circuit 115).

The voltage generator 130 may generate a voltage, e.g., a program voltage PV for programming of the OTP memory device 200 according to the control code generated by the control logic 120. The program voltage PV may include a write voltage and a read voltage. The write voltage may be greater than the read voltage.

The row decoder 140 may decode the row address XADD according to a control signal CTR received from the control logic 120. The column decoder 150 may decode the column address YADD under the control of the control logic 120.

The write driver and S/A block 160 may function as a sense amplifier that can sense and amplify a voltage level of each of a plurality of column lines included in the memory cell array 110 according to the control of the control logic 120 when the semiconductor memory device 100 performs a read operation. The write driver and S/A block 160 may function as a write driver that can drive each of the column lines included in the memory cell array 110 according to the control of the control logic 120 when the semiconductor memory device 100 performs a write operation.

The I/O block 170 may transmit data from an external device to the column decoder 150 and transmit data from the column decoder 150 to a device outside the semiconductor memory device 100, e.g., a memory controller (not shown).

The OTP memory device 200 may be used to repair the semiconductor memory device 100. For example, the characteristics of the semiconductor memory device 100 obtained according to a result of testing the semiconductor memory device 100 may be stored in the OTP memory device 200 embedded in the semiconductor memory device 100 and the semiconductor memory device 100 may operate based on the information stored in the OTP memory device 200, reducing a likelihood that the semiconductor memory device 100 may malfunction.

The OTP memory device 200 may store data about the trimming of voltage or current for the operation of the semiconductor memory device 100. Example aspects described below discuss an antifuse, but the present disclosure encompasses usage of a fuse as well.

The OTP memory device 200 may store defective cell address data about defective cells in the memory cell array 110. For example, the OTP memory device 200 may store row data including a row address of defective cells or column data including a column address of defective cells. In other embodiments, the OTP memory device 200 may store information, such as data about an operating frequency or data about a DC voltage level, related to the operation of the semiconductor memory device 100.

The OTP memory device 200 may transmit programming information (e.g., read or write operation information) to the voltage generator 130. The voltage generator 130 may generate the program voltage PV based on the programming information. Many other uses of the OTP memory device 200 may be provided.

Figure 1B:
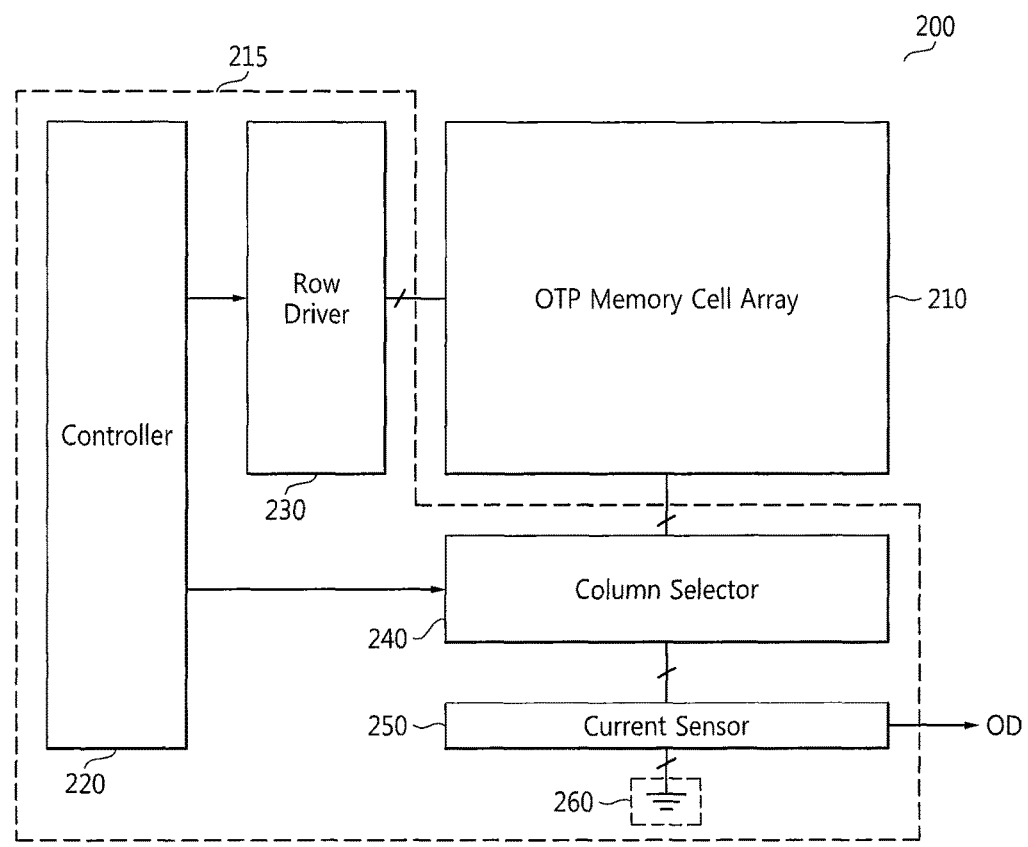
FIG. 1B is a block diagram of a one-time programmable memory device according to some aspects of the present disclosure.

The structure and operations of the OTP memory device 200 will be described in detail with reference to FIG. 1B. FIG. 1B is a block diagram of the OTP memory device 200 according to some aspects of the present disclosure. Referring to FIGS. 1A and 1B, the OTP memory device 200 may include an OTP memory cell array 210 and an access circuit 215. The OTP memory cell array 210 may include a plurality of antifuses to store data. Although the inventive concepts described herein may also be applied to an OTP memory cell array including a plurality of fuses, the description below considers an OTP memory cell array 210 that includes antifuses. In other embodiments, the program voltage PV generated by the voltage generator 130 may be directly applied to the OTP memory cell array 210.

The access circuit 215 may include a controller 220, a row driver 230, a column selector 240, a current sensor 250, and a ground node 260. In other embodiments, the access circuit 215 may be included in a row decoder (not shown), a column decoder (not shown), or a sense amplifier block (not shown), which may provide similar functionality to the OTP memory device 200 as the row decoder 140, column decoder 150, and the sense amplifier block 160 provide to the semiconductor memory device 100.

The controller 220 may control the overall operation of the access circuit 215. Although now shown in FIG. 1B, the controller 220 may transmit the program voltage PV from the voltage generator 130 to the OTP memory cell array 210.

The program voltage PV may be determined as a read voltage or a write voltage according to the control of the controller 220.

The row driver 230 may activate or drive at least one of a plurality of word lines included in the OTP memory cell array 210 according to the control of the controller 220. The column selector 240 may select at least one of a plurality of bit lines included in the OTP memory cell array 210 according to the control of the controller 220. A bit line selected by the column selector 240 may be connected to the ground node 260. This will be described in further detail below with reference to FIGS. 7 and 8.

The current sensor 250 may sense current flowing in the bit lines and may transmit OTP data OD to an outside (e.g., a memory controller (not shown) of the OTP memory device 200 based on the sensing result. The ground node 260 may apply 0 V, but the present disclosure is not limited to the embodiments discussed herein. Therefore, the ground node 260 may apply a supply voltage other than 0 V in other embodiments.

Figure 2:
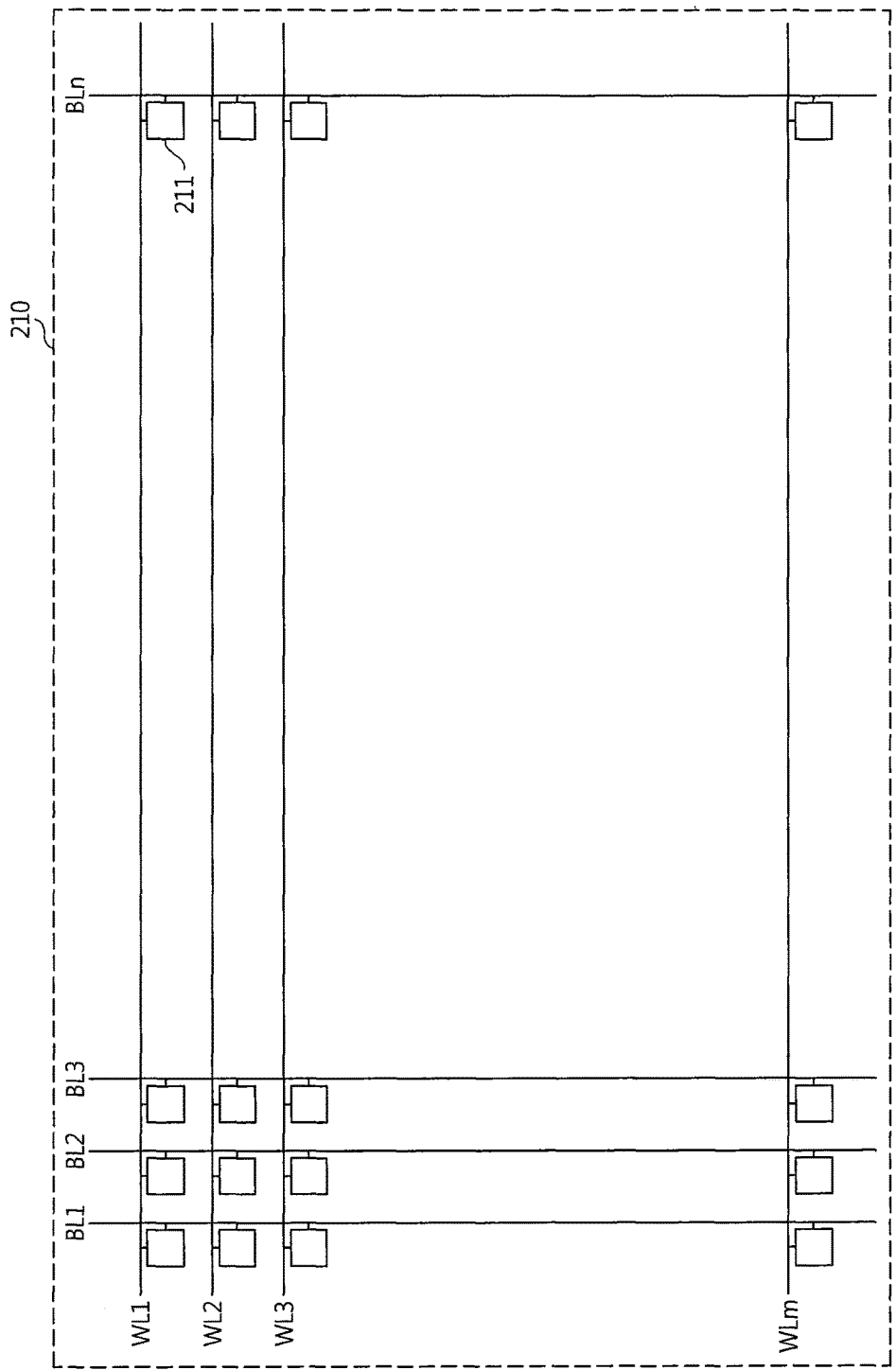
FIG. 2 is a block diagram of an OTP memory cell array according to aspects of the present disclosure.

FIG. 2 is a block diagram of the OTP memory cell array 210 according to some aspects of the present disclosure. Referring to FIGS. 1B and 2, the OTP memory cell array 210 may include a plurality of word lines WL1 through WLm, a plurality of bit lines BL1 through BLn, and a plurality of OTP memory cells 211, where "m" and "n" may be integers greater than or equal to 4.

Each of the OTP memory cells 211 may be connected to one of the word lines WL1 through WLm and one of the bit lines BL1 through BLn. At least one of the word lines WL1 through WLm may be activated or driven by the row driver 230. At least one of the bit lines BL1 through BLn may be selected by the column selector 240. At least one selected bit line may be connected to the ground node 260. The OTP data OD may be written to or read from an OTP memory cell 211 connected to the activated word line and the selected bit line. Although not shown in FIG. 2, the OTP memory cell array 210 may also include a signal line used to program the OTP memory cells 211. At this time, the OTP memory cells 211 may be connected to the signal line.

As shown in FIG. 2, OTP memory cells 211 arranged along one vertical or column line may be respectively connected to the word lines WL1 through WLm and may share one bit line with one another. Also, OTP memory cells 211 arranged along one horizontal or row line may be respectively connected to the bit lines BL1 through BLn and may share one word line with one another.

Meanwhile, the number of bits in data programmed to the OTP memory cell array 210 may be fewer than "n", e.g., the number of the bit lines BL1 through BLn. For example, while the OTP memory cell array 210 includes a total of "n" bit lines, as shown in FIG. 2; the number of bits in data programmed may be n/2, n/4, or n/8.

Figure 3:
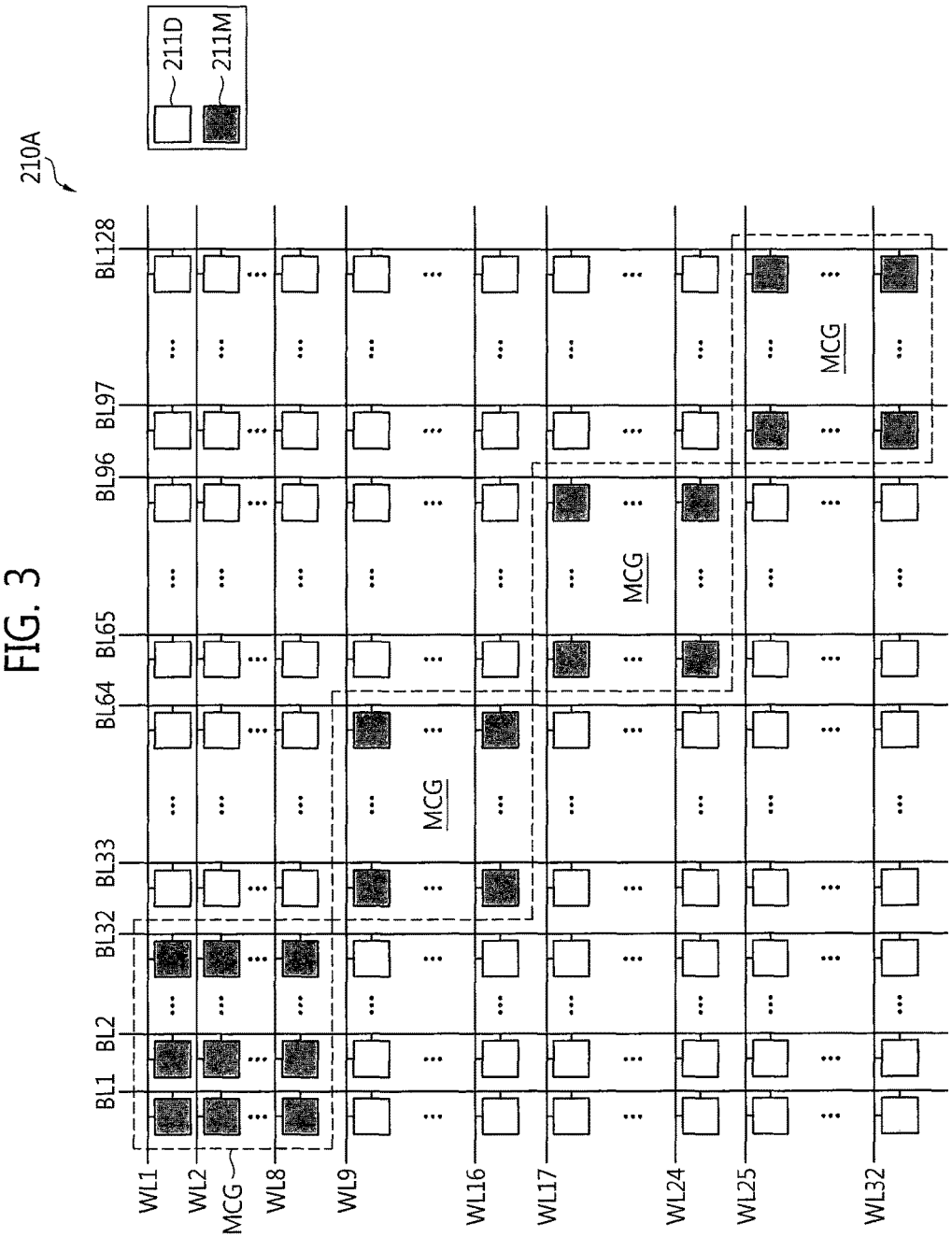
FIG. 3 is a block diagram of an OTP memory cell array according to aspects of the present disclosure.
Figure 4A:
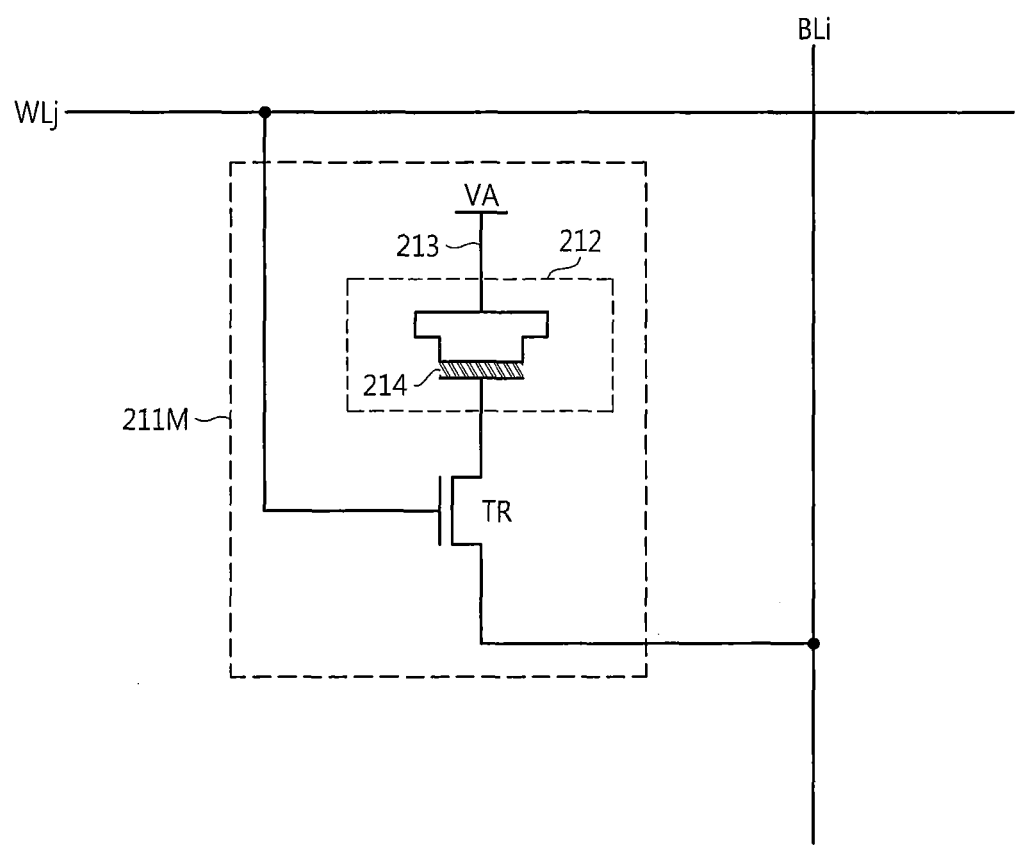
FIG. 4A is a block diagram of a main cell according to some aspects of the present disclosure.
Figure 4B:
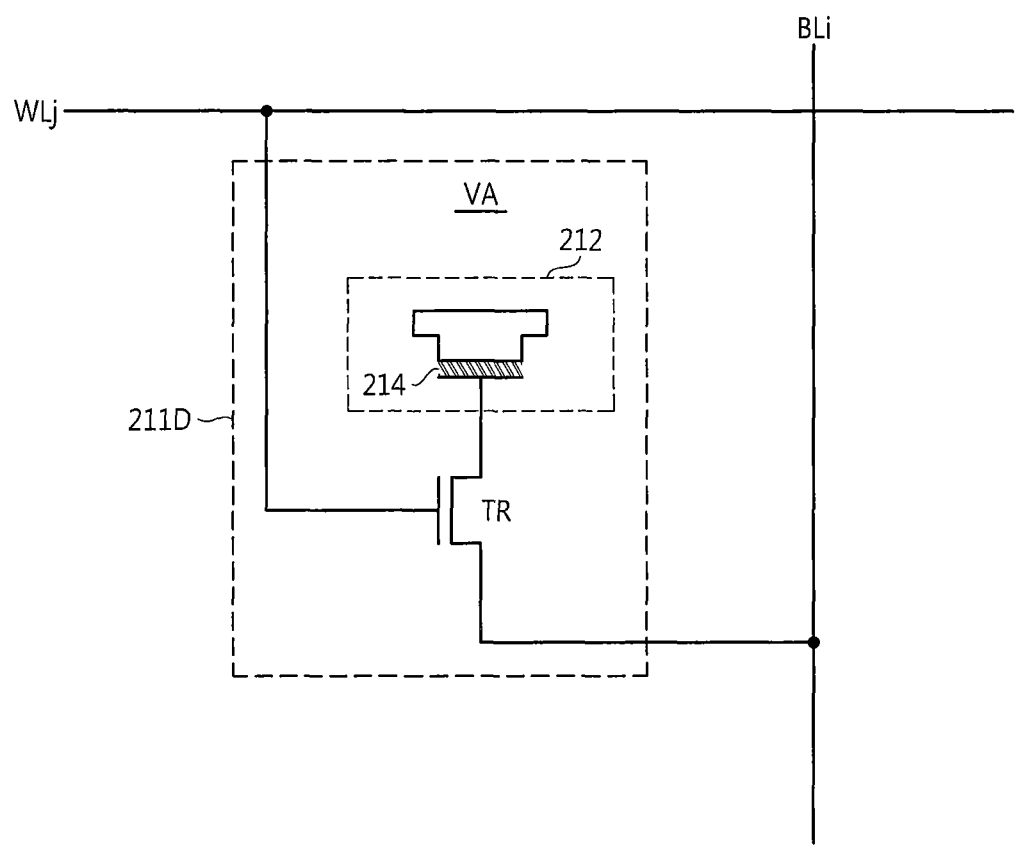
FIG. 4B is a block diagram of a dummy cell according to some aspects of the present disclosure.
Figure 5:
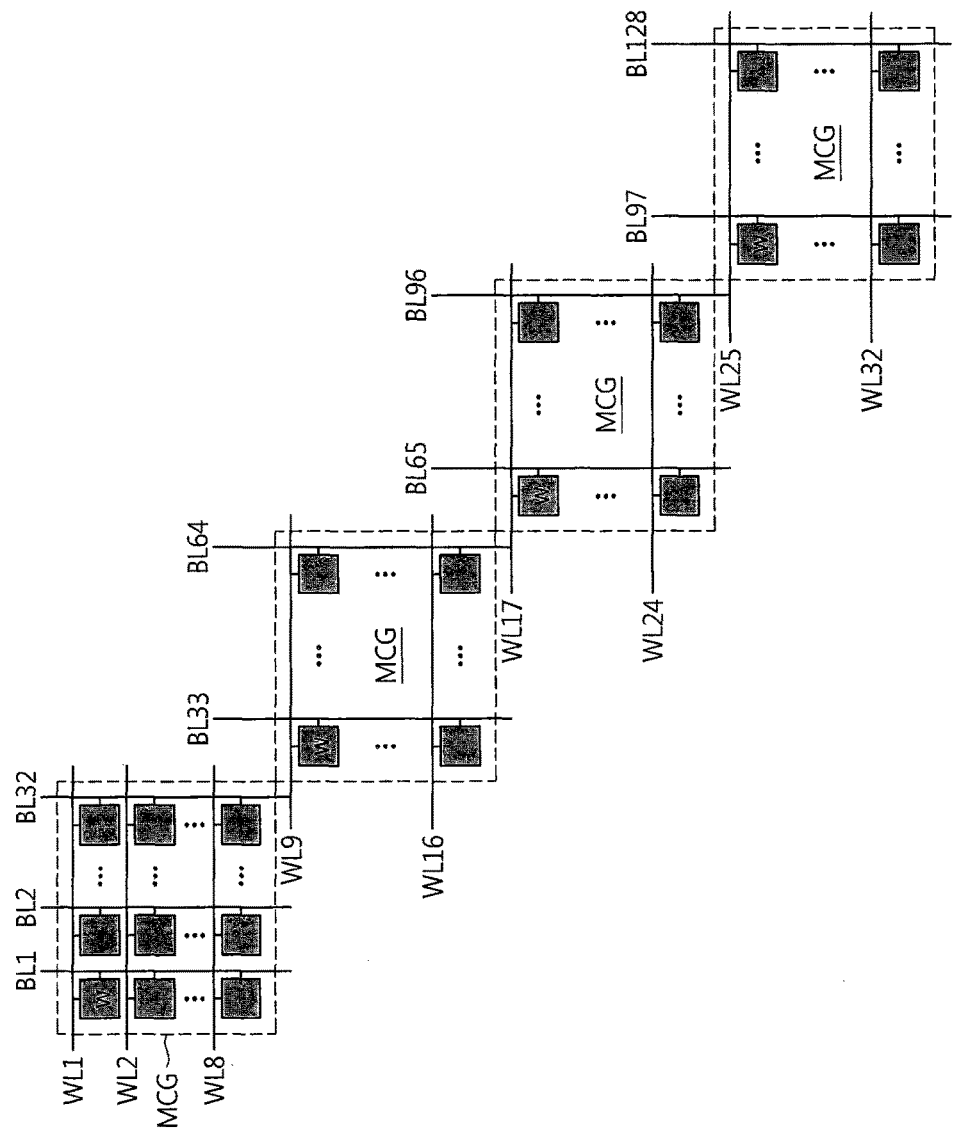
FIG. 5 is a block diagram showing the operation of an OTP memory cell array according to some aspects of the present disclosure.

FIG. 3 is a block diagram of an OTP memory cell array according to other aspects of the present disclosure. FIG. 4A is a block diagram of a main cell according to some aspects of the present disclosure. FIG. 4B is a block diagram of a dummy cell according to some aspects of the present disclosure. FIG. 5 is a block diagram showing the operation of an OTP memory cell array according to some aspects of the present disclosure.

In the example embodiment illustrated in FIG. 3, there may be a total of 128 bit lines BL1 through BL128 and a total of 32 word lines WL1 through WL32, although there may be more or fewer of each in other embodiments. An OTP memory cell array 210A illustrated in FIG. 3 may be an example of the OTP memory cell array 210 illustrated in FIG. 1B.

Referring to FIGS. 3 through 5, the OTP memory cells 211 included in the OTP memory cell array 210A may include a plurality of main cell groups MCGs and a plurality of dummy cells 211D. Each of the main cell groups MCGs may include a plurality of main cells 211M. In other words, the OTP memory cell array 210A may include a plurality of main cells 211M and a plurality of dummy cells 211D.

Word lines and bit lines which are connected to each of the main cell groups MCGs might not overlap those connected to the other main cell groups MCGs. For example, one of the main cell groups MCGs may be connected to the first through eighth word lines WL1 through WL8 (as illustrated in the top left corner of FIG. 3), another one of the main cell groups MCGs may be connected to the ninth through 16th word lines WL9 through WL16 (as illustrated toward the center of FIG. 3), still another one of the main cell groups MCGs may be connected to the 17th through 24th word lines WL17 through WL24, and yet another one of the main cell groups MCGs may be connected to the 25th through 32nd word lines WL25 through WL32 (as illustrated in the bottom right corner of FIG. 3). Similarly, one of the main cell groups MCGs may be connected to the first through 32nd bit lines BL1 through BL32, another one of the main cell groups MCGs may be connected to the 33rd through 64th bit lines BL33 through BL64, still another one of the main cell groups MCGs may be connected to the 65th through 96th bit lines BL65 through BL96, and yet another one of the main cell groups MCGs may be connected to the 97th through 128th bit lines BL97 through BL128.

Although there are four main cell groups MCGs and a total of 256 main cells 211M in each main cell group MCG illustrated in FIG. 3, it is to be appreciated that the inventive concepts are not restricted specific numbers of main cell groups or main cells within the main cell groups. The number of the main cells 211M or the number of word lines may vary with the number of the main cell groups MCGs.

FIG. 4A shows a main cell 211M connected to a word line WLj and a bit line BLi. Referring to FIG. 4A, the main cell 211M may include a transistor TR, an antifuse circuit 212, and a contact layer 213.

The transistor TR may control whether to program data to the main cell 211M. A gate node of the transistor TR may be connected to the word line WLj. Accordingly, when the word line WLj is activated; a passage of charges may be formed between source and drain nodes of the transistor TR, the antifuse circuit 212 may be connected to the bit line BLi, and a supply voltage VA may be applied to the antifuse circuit 212. When the word line WLj is deactivated, the antifuse circuit 212 may be disconnected from the bit line BLi.

The supply voltage VA applied to a terminal of the antifuse circuit 212 may be the program voltage PV generated by the voltage generator 130 illustrated in FIG. 1A. The supply voltage VA may be a read voltage in a read operation and may be a write voltage in a write operation.

The write voltage may be high enough to break a gate oxide film 214 of the antifuse circuit 212. In other words, the gate oxide film 214 of the antifuse circuit 212 included in the main cell 211M that is connected to the word line WLj activated and the bit line BLi selected may be broken.

The resistance of the antifuse circuit 212 may be different depending on whether the gate oxide film 214 is broken or not. In other words, the resistance of the antifuse circuit 212 may be low when the gate oxide film 214 is broken and may be high when the gate oxide film 214 is not broken.

When the resistance of the antifuse circuit 212 is low, current flowing into the bit line BLi may be relatively high. When the resistance of the antifuse circuit 212 is high, current flowing into the bit line BLi may be relatively low.

Referring to FIG. 1B, the current sensor 250 may sense a difference in current flowing into the bit line BLi and output the OTP data OD stored in the OTP memory cell array 210A. However, aspects of the present disclosure are not limited to these embodiments and may be applied to a main cell 211M having a different structure than that shown in FIG. 4A.

The antifuse circuit 212 may include a depletion-type metal-oxide semiconductor (MOS) transistor in which a source node is connected with a drain node. The antifuse circuit 212 is implemented as a depletion-type MOS transistor in the embodiments illustrated in FIGS. 4A and 4B. However, the present disclosure is not limited to the embodiments illustrated in FIGS. 4A and 4B.

The resistance of the antifuse circuit 212 may be high due to the gate oxide film 214. The antifuse circuit 212 having high resistance may substantially indicate an open state where current does not flow. When the gate oxide film 214 is broken by applying a breakdown voltage to both terminals of the antifuse circuit 212, the resistance of the antifuse circuit 212 becomes low and irreversible. The antifuse circuit 212 having low resistance may substantially indicate a short state where current flows.

The contact layer 213 may be a conducting wire connecting the antifuse circuit 212 with the supply voltage VA. The contact layer 213 may include a via or a contact ball.

Referring to FIG. 4B, a dummy cell 211D may include the transistor TR and the antifuse circuit 212. To avoid redundancy of the description, only differences between the main cell 211M and the dummy cell 211D will be described below.

Unlike the main cell 211M, the dummy cell 211D may not include the contact layer 213. In other words, the breakdown voltage may not be applied to either of the terminals of the antifuse circuit 212 in the dummy cell 211D, and therefore, the gate oxide film 214 may not be broken. The implement of the dummy cell 211D is not restricted to the embodiments illustrated in FIG. 4B. The dummy cell 211D may be implemented in various manners.

FIG. 5 shows only the main cells 211M included in the OTP memory cell array 210 in order to explain the operation of the OTP memory cell array 210. Referring to FIGS. 4A and 5, the OTP memory cell array 210 may include a plurality of the main cell groups MCGs. Each of the main cell groups MCGs may include a plurality of main cells 211M. Although there are a total of 128 bit lines BL1 through BL128, a total of 32 word lines WL1 through WL32, and four main cell groups MCGs in the current embodiments, the present disclosure is not restricted to these embodiments.

Four bits may be simultaneously written to the OTP memory device 200 including the OTP memory cell array 210 illustrated in FIG. 5. In detail, data may be written to one of main cells 211M included in each of the main cell groups MCGs. The cells 211 to which the data is written are marked with "W" in FIG. 5.

For instance, data may be written in parallel or simultaneously to a main cell connected to the first bit line BL1 and the first word line WL1, a main cell connected to the 33rd bit line BL33 and the ninth word line WL9, a main cell connected to the 65th bit line BL65 and the 17th word line WL17, and a main cell connected to the 97th bit line BL97 and the 25th word line WL25. In other words, the first, 33rd, 65th and 97th bit lines BL1, BL33, BL65, and BL97 and the first, ninth, 17th and 25th word lines WL1, WL9, WL17, and WL25 are simultaneously activated, so that multi-bit data, i.e., four-bit data can be written to the OTP memory device 200.

According to some aspects of the present disclosure, the dummy cells 211D are formed around the main cell groups MCGs in the OTP memory cell array 210, and therefore, the OTP memory device 200 can write multiple bits simultaneously in a reliable operation even when a plurality of bit lines and word lines are activated at the same time.

Figure 6:
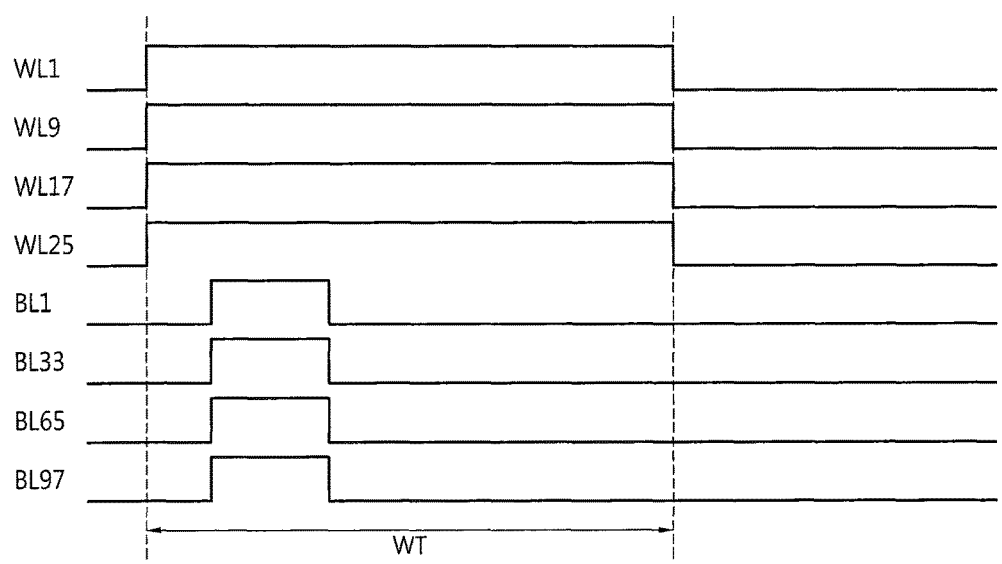
FIG. 6 is a timing chart showing the operation of an OTP memory device according to some aspects of the present disclosure.

FIG. 6 is a timing chart showing the operation of an OTP memory device according to some aspects of the present disclosure. Referring to FIGS. 5 and 6, at least one of the word lines WL1 through WL32 may be activated during a write time WT. Being activated may mean being driven or being enabled.

The write time WT may be duration during which one or more word lines are activated. For instance, in the operation of the OTP memory cell array 210 illustrated in FIG. 5, the first, ninth, 17th and 25th word lines WL1, WL9, WL17, and WL25 may be activated during the write time WT.

Referring to FIGS. 4A and 6, the supply voltage VA (i.e., the write voltage) may be applied to a terminal of the antifuse circuit 212 of the main cell 211M connected to an activated word line during the write time WT. It is assumed that word lines are simultaneously activated during the write time WT in the current embodiments, but such simultaneous activation is exemplary and the present disclosure is not limited to this embodiment.

At least one of the bit lines BL1 through BL128 may be activated for a portion of the write time WT. For instance, in the operation of the OTP memory cell array 210 illustrated in FIG. 5, the first, 33rd, 65th and 97th bit lines BL1, BL33, BL65, and BL97 may be activated for a portion of the write time WT, as illustrated in FIG. 6.

Referring to FIGS. 1B, 4A, and 6, a voltage of the ground node 260 may be applied to another terminal of the antifuse circuit 212 of the main cell 211M connected to an activated bit line for a while during the write time WT. All selected bit lines are simultaneously activated for a while during the write time WT in the current embodiments, but the present disclosure is not limited to these embodiments. According to aspects of the present disclosure, the OTP memory device 200 can write multi-bit data within the write time WT.

Figure 7:
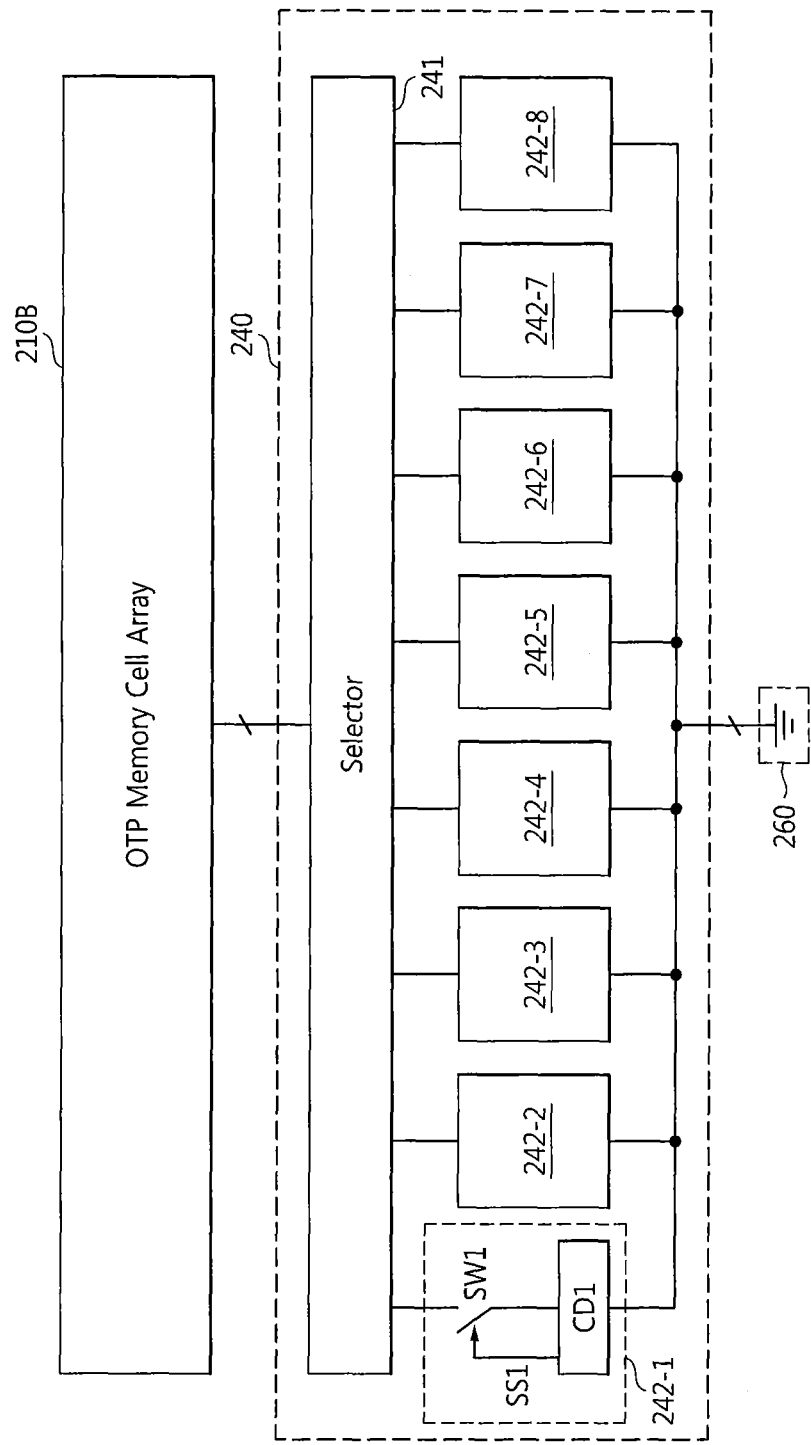
FIG. 7 is a block diagram showing the structure of a column selector according to some aspects of the present disclosure.

FIG. 7 is a block diagram showing the structure of the column selector 240 according to some aspects of the present disclosure. An OTP memory cell array 210B illustrated in FIG. 7 may be the OTP memory cell array 210A illustrated in FIG. 3 or the OTP memory cell array 210 illustrated in FIG. 2.

Referring to FIG. 7, the column selector 240 may include a plurality of switching circuits 242-1 through 242-8. There are eight switching circuits 242-1 through 242-8 in the embodiments illustrated in FIG. 7, but the present disclosure is not in any way limited to the specific number of switching circuits illustrated in FIG. 7.

Each of the switching circuits 242-1 through 242-8 may include a switch and a current detector. The first switching circuit 242-1 will be described to explain the operation of the switching circuits 242-1 through 242-8, and the description is applicable to the other switching circuits 242-2 through 242-8. The first switching circuit 242-1 may include a first switch SW1 and a first current detector CD1.

The first switch SW1 may control the flow of current in a bit line according to a first switch signal SS1. The first current detector CD1 may detect the flow of current in the bit line and may output the first switch signal SS1 to the first switch SW1 according to the detection result. For example, when current flows in the bit line, the first current detector CD1 may output the first switch signal SS1 to the first switch SW1 to turn off the first switch SW1.

The column selector 240 may also include a selector circuit 241. The selector circuit 241 may select some of a plurality of bit lines. For instance, the selector circuit 241 may select eight bit lines from among the 128 bit lines BL1 through BL128.

Figure 8:
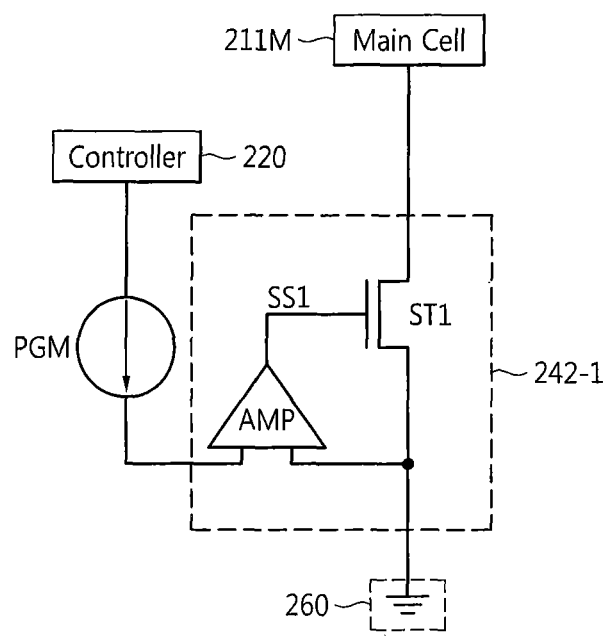
FIG. 8 is a circuit diagram showing the structure of a switching circuit according to some aspects of the present disclosure.

FIG. 8 is a circuit diagram showing the structure of the switching circuit 242-1 according to some aspects of the present disclosure. Referring to FIG. 8, the first switch SW1 may be implemented as a transistor ST1 and the first current detector CD1 may be implemented as an operational amplifier AMP.

The controller 220 illustrated in FIG. 1B may apply a program current PGM that has been programmed to the first current detector CD1. Accordingly, the first current detector CD1 may change a signal applied to a gate node of the first switch SW1 when current flows in a corresponding bit line. When the signal applied to the gate node of the first switch SW1 is changed, the first switch SW1 may prohibit current from flowing in the bit line. In other words, referring to FIG. 4A, when the gate oxide film 214 of the antifuse circuit 212 included in the main cell 211M is broken and current flows in the bit line, the current flow in the bit line may be cut off by the operation of the switching circuit 242-1.

Figure 9:
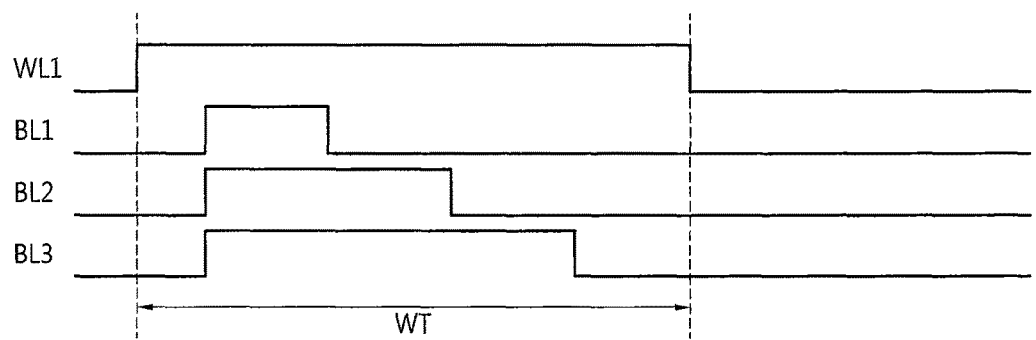
FIG. 9 is a timing chart showing the operation of an OTP memory device according to other aspects of the present disclosure.

FIG. 9 is a timing chart showing the operation of an OTP memory device according to aspects of the present disclosure. To avoid redundancy, only the differences between the timing chart illustrated in FIG. 6 and the timing chart illustrated in FIG. 9 will be described.

Referring to FIGS. 7 through 9, one word line may be activated during the write time WT in the embodiments illustrated in FIG. 9 unlike in the embodiments illustrated in FIG. 6. For example, the first word line WL1 may be activated during the write time WT in the operation of the OTP memory device 200 illustrated in FIG. 7.

At least one of the bit lines BL1 through BL128 may be activated for a while during the write time WT. For example, the first through third bit lines BL1 through BL3 may be activated at the same time within the period of the write time WT.

As described above with reference to FIGS. 4A, 7, and 8, when current flows in the main cell 211M connected to activated word line and bit line, the switch SW1 of the switching circuit 242-1 is turned off and the current flowing in the activated bit line is cut off. For example, when current flows in the first through third bit lines BL1 through BL3; the current flows in the first bit line BL1 may first be cut off by the operation of the first switching circuit 242-1, the current flows in the second bit line BL2 may secondly be cut off by the operation of the second switching circuit 242-2, and the current flows in the third bit line BL3 may lastly be cut off by the operation of the third switching circuit 242-3.

Accordingly, the OTP memory device 200 may write multi-bit data within the write time WT. Although one or more bit lines are activated at the same time in the embodiments illustrated in FIG. 9, the present disclosure is not restricted to the embodiments illustrated in FIG. 9. One or more bit lines may be sequentially or overlappingly activated within the period of the write time WT in other embodiments.

Figure 10:
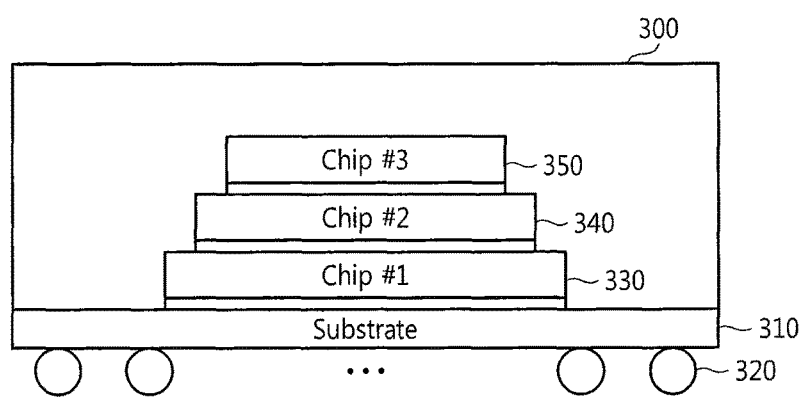
FIG. 10 is a conceptual diagram of a package including a semiconductor memory device according to some aspects of the present disclosure.

FIG. 10 is a conceptual diagram of a package 300 that includes the semiconductor memory device 100 illustrated in FIG. 1A according to some aspects of the present disclosure. Referring to FIGS. 1A and 10, the package 300 may include a plurality of semiconductor devices 330, 340, and 350 sequentially stacked on a package substrate 310. Each of the semiconductor devices 330 through 350 may be the semiconductor memory device 100. The package 300 may be a Package on Package (PoP), a Ball Grid Array (BGA), a Chip Scale Package (CSP), a Plastic Leaded Chip Carrier (PLCC), a Plastic Dual In-line Package (PDIP), a Chip On Board (COB), a CERamic Dual In-line Package (CERDIP), a plastic Metric Quad Flat Pack (MQFP), a Thin Quad Flat Pack (TQFP), a Small Outline Integrated Circuit (SOIC), a Shrink Small Outline Package (SSOP), a Thins Small Outline Package (TSOP), a System In Package (SIP), a Multi Chip Package (MCP), a Wafer-level Package (WLP), and/or a Wafer-level processed Stack Package (WSP).

A memory controller (not shown) may be implemented within at least one of the semiconductor devices 330 through 350 or may be implemented on the package substrate 310. Electrical vertical connection means, e.g., a through-silicon via (TSV), may be used to electrically connect the semiconductor devices 330 through 350 with one another.

The package 300 may be implemented as a hybrid memory cube (HMC) having a structure in which a memory controller and a memory cell array die are stacked. When the package 300 is implemented as the HMC, the performance of a semiconductor memory device is increased due to the increase of a bandwidth and the area of the semiconductor memory device is minimized. As a result, power consumption and manufacturing cost can be reduced.

Figure 11:
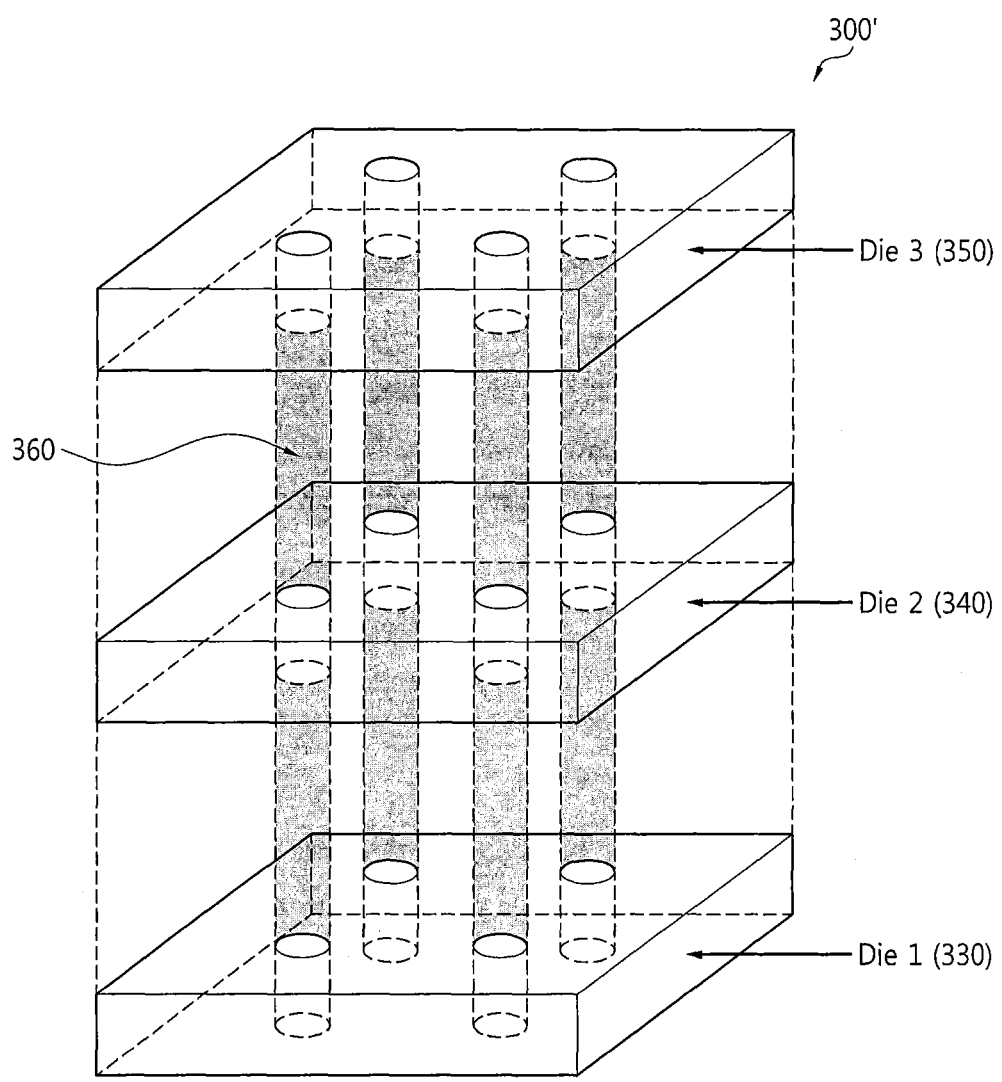
FIG. 11 is a three-dimensional conceptual diagram of a package including a semiconductor memory device according to some aspects of the present disclosure.

FIG. 11 is a three-dimensional conceptual diagram of a package 300' including the semiconductor memory device 100 illustrated in FIG. 1A according to aspects of the present disclosure. Referring to FIGS. 1A, 10, and 11, the package 300' includes a plurality of dies, i.e., the semiconductor devices 330 through 350 that are connected with one another through TSVs 360 in a stack structure.

Figure 12:
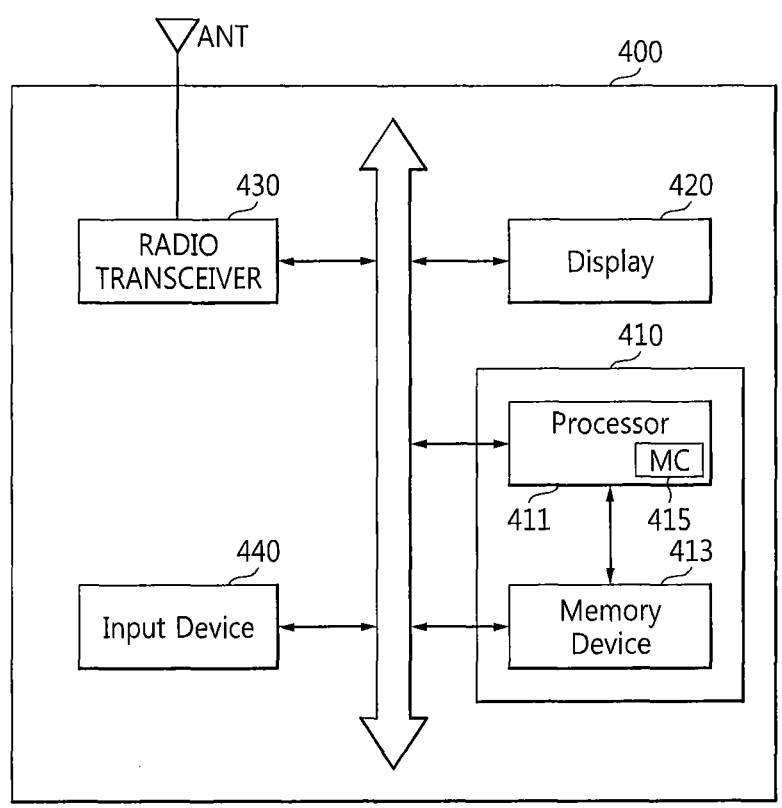
FIG. 12 is a block diagram of a system including a semiconductor memory device according to some aspects of the present disclosure.

FIG. 12 is a diagram of a system 400 including the semiconductor memory device illustrated in FIG. 1A according to some aspects of the present disclosure. Referring to FIGS. 1A, and 10 through 12, the system 400 may be implemented as an electronic device or a portable device. The portable device may be implemented as a cellular phone, a smart phone, or a tablet PC.

The system 400 includes a processor 411 and a semiconductor memory device 413. The semiconductor memory device 413 and/or any other block of FIG. 12 may include the semiconductor memory device 100 illustrated in FIG. 1A. The processor 411 and the semiconductor memory device 413 may be packaged in a package 410. In this case, the package 410 may be mounted on a system board (not shown). The package 410 may be the package 300 shown in FIG. 10 or the package 300' shown in FIG. 11.

The processor 411 may include a memory controller 415 controlling a data access operation, e.g., a write operation or a read operation, of the semiconductor memory device 413. The memory controller 415 is controlled by the processor 411 that controls the overall operation of the system 400. The memory controller 415 may be connected between the processor 411 and the semiconductor memory device 413.

Data of the semiconductor memory device 413 may be displayed through a display 420 according to the control of the processor 411. A radio transceiver 430 may transmit or receive radio signals through an antenna ANT. The radio transceiver 430 may convert radio signals received through the antenna ANT into signals that can be processed by the processor 411. Accordingly, the processor 411 may process the signals output from the radio transceiver 430 and store the processed signals into the semiconductor memory device 413 or display the processed signals through the display 420. The radio transceiver 430 may also convert signals output from the processor 411 into radio signals and output the radio signals to an external device through the antenna ANT.

An input device 440 may enable control signals for controlling the operation of the processor 411 or data to be processed by the processor 411 to be input to the semiconductor memory device 413. The input device 440 may be implemented as a pointing device such as a touch pad or a computer mouse, a keypad, or a keyboard.

The processor 411 may control the operation of the display 420 to display data output from the memory controller 420, data output from the radio transceiver 430, and/or data output from the input device 440.

Figure 13:
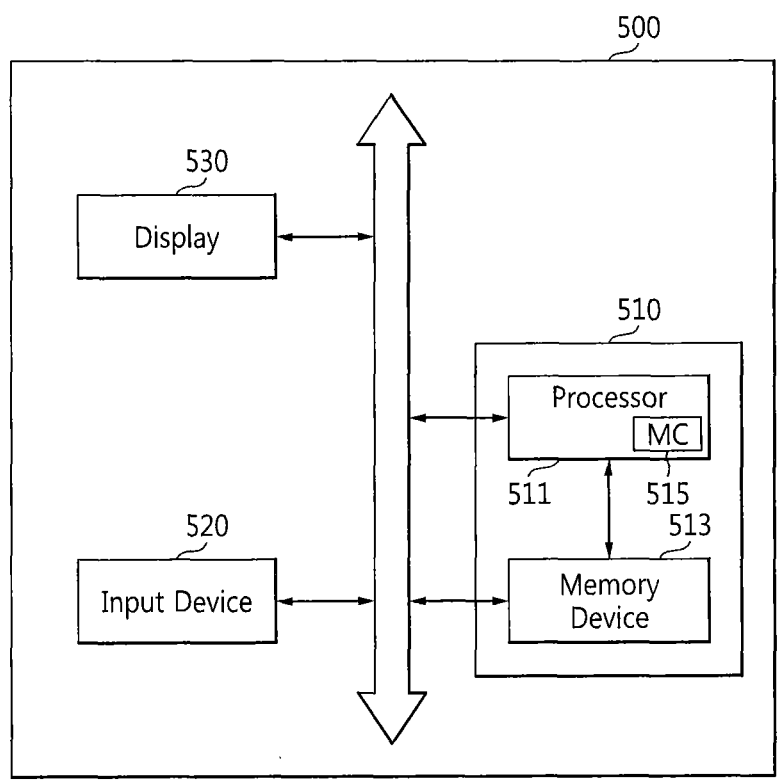
FIG. 13 is a block diagram of a system including a semiconductor memory device according to some aspects of the present disclosure.

FIG. 13 is a block diagram of a system 500 including the semiconductor memory device illustrated in FIG. 1A according to some aspects of the present disclosure.

Referring to FIGS. 1A, and 10, 11 and 13, the system 500 may be implemented as a personal computer (PC), a tablet PC, a net-book, an e-reader, a personal digital assistant (PDA), a portable multimedia player (PMP), an MP3 player, and/or an MP4 player.

The system 500 includes a processor 511 controlling the overall operation of the system 500, and the semiconductor memory device 513. The semiconductor memory device 513 and/or any other block of FIG. 13 may include the semiconductor memory device 100 illustrated in FIG. 1A.

The processor 511 and the semiconductor memory device 513 may be packaged in a package 510. In this case, the package 510 may be mounted on a system board (not shown). The package 510 may be the package 300 shown in FIG. 10 or the package 300' shown in FIG. 11.

The processor 511 may include a memory controller 515 for controlling the operation of the semiconductor memory device 513.

The processor 511 may display data stored in the semiconductor memory device 513 through the display 530 according to data input through the input device 520. The input device 520 may be implemented by a pointing device such as a touch pad or a computer mouse, a keypad, or a keyboard.

Figure 14:
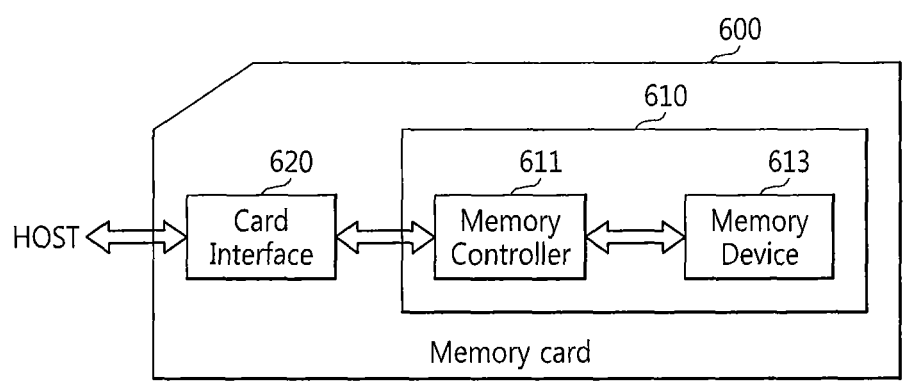
FIG. 14 is a block diagram of a system including a semiconductor memory device according to some aspects of the present disclosure.

FIG. 14 is a block diagram of a system 600 including the semiconductor memory device illustrated in FIG. 1A according to some aspects of the present disclosure. Referring to FIGS. 1A, and 10, 11 and 14, the system 600 may be implemented as a memory card or a smart card.

The system 600 may include the semiconductor memory device 613, a memory controller 611, and a card interface 610. The semiconductor memory device 613 and/or any other block of FIG. 14 may include the semiconductor memory device 100 illustrated in FIG. 1A.

The processor 611 and the semiconductor memory device 613 may be packaged in a package 610. In this case, the package 610 may be mounted on a system board (not shown). The package 610 may be the package 300 shown in FIG. 10 or the package 300' shown in FIG. 11.

The memory controller 611 may control data exchange between the semiconductor memory device 613 and the card interface 610.

According to some embodiments, the card interface 610 may be a secure digital (SD) card interface or a multi-media card (MMC) interface, but other card interfaces are envisioned in other embodiments.

The card interface 610 may interface a host and the memory controller 611 for data exchange according to a protocol of the host.

When the system 600 is connected with the host such as a PC, a tablet PC, a digital camera, a digital audio player, a cellular phone, a console video game hardware, or a digital set-top box, the host may perform data communication with the semiconductor memory device 613 through the card interface 610 and the memory controller 611.

Figure 15:
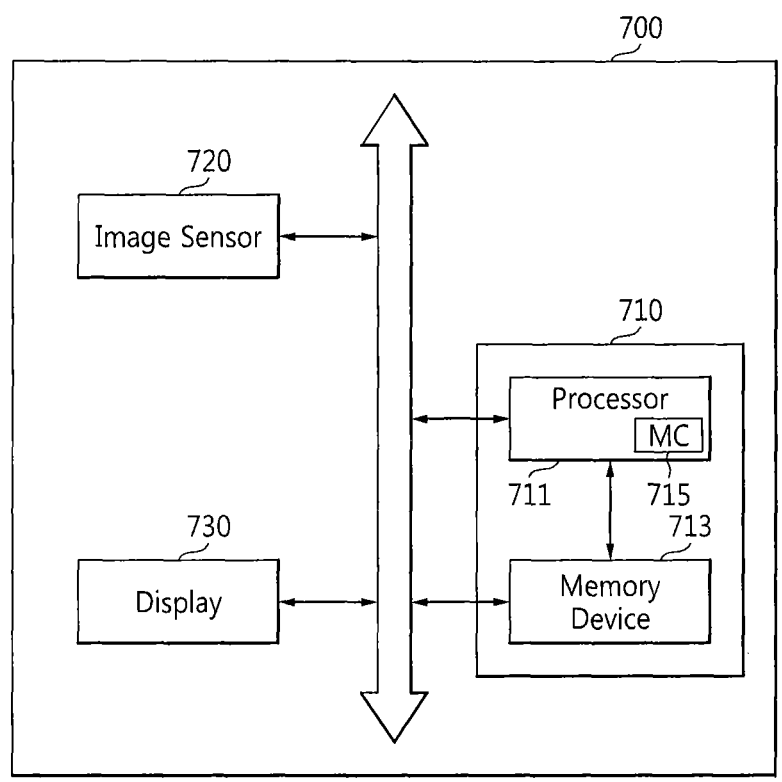
FIG. 15 is a block diagram of a system including a semiconductor memory device according to some aspects of the present disclosure.

FIG. 15 is a block diagram of a system 700 including the semiconductor memory device illustrated in FIG. 1A according to some aspects of the present disclosure. Referring to FIGS. 1A, 10, 11 and 15, the system 700 may be implemented as a digital camera, or a portable device equipped with a digital camera.

The system 700 includes a processor 711 controlling the overall operation of the system 700, and the semiconductor memory device 713. The semiconductor memory device 713 and/or any other block of FIG. 15 may include the semiconductor memory device 100 illustrated in FIG. 1A.

The processor 711 and the semiconductor memory device 713 may be packaged in a package 710. In this case, the package 710 may be mounted on a system board (not shown). The package 710 may be the package 300 shown in FIG. 10 or the package 300' shown in FIG. 11.

The image sensor 720 included in the system 700 converts optical images into digital signals. The digital signals may be controlled by the processor 711 to be displayed through the display 730 or stored in the semiconductor memory device 713. Data stored in the semiconductor memory device 713 may be displayed through the display 730 according to the control of the processor 711.

Figure 16:
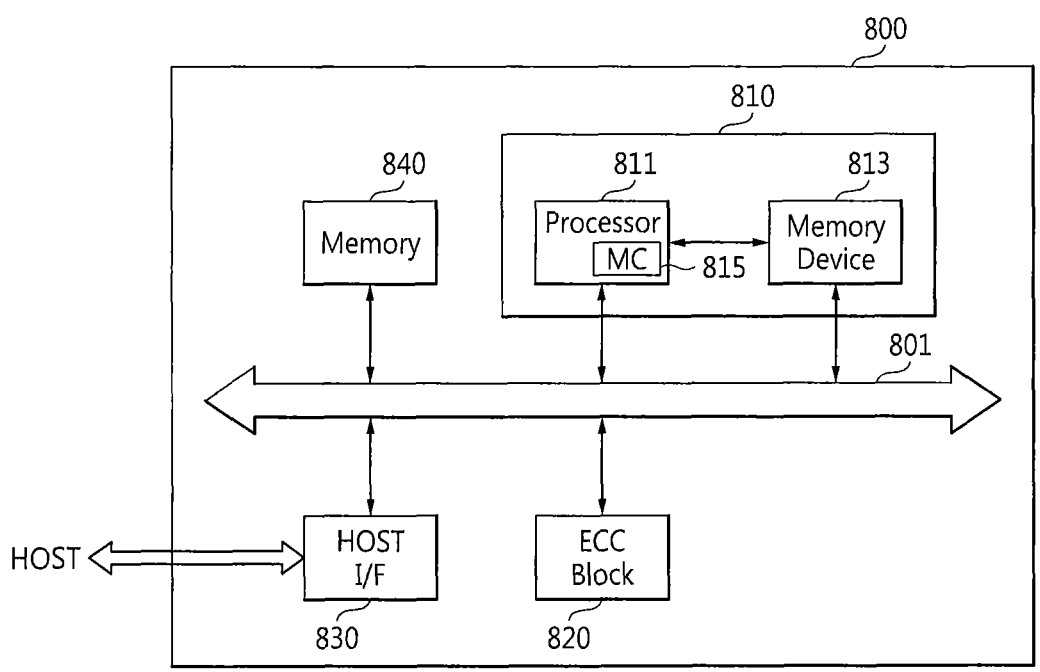
FIG. 16 is a block diagram of a system including a semiconductor memory device according to some aspects of the present disclosure.

FIG. 16 is a block diagram of a system 800 including the semiconductor memory device illustrated in FIG. 1A according to some aspects of the present disclosure. Referring to FIGS. 1A, 10, 11 and 16, the system 800 includes a semiconductor memory device 813 and a processor 811 controlling the overall operation of the system 700. The semiconductor memory device 813 and/or any other block of FIG. 16 may include the semiconductor memory device 100 illustrated in FIG. 1A.

The processor 811 and the semiconductor memory device 813 may be packaged in a package 810. In this case, the package 810 may be mounted on a system board (not shown). The package 810 may be the package 300 shown in FIG. 10 or the package 300' shown in FIG. 11.

The processor 811 includes a memory controller 815 for controlling the operations of the semiconductor memory device 813. The system 800 includes a memory 840 which may be used as an operation memory of the processor 811. The memory 840 may be implemented by a non-volatile memory such as a ROM (read only memory) or a flash memory.

The host connected with the system 800 may perform data communication with the semiconductor memory device 813 through the processor 811 and a host interface 830.

The memory controller 815 may perform the function of the memory interface. The system 800 may further include ECC (error correction code) block 820.

The ECC block 820 is controlled by the processor 811 to detect an error bit included in data output from the semiconductor memory device 813 through the memory controller 815, correct the error bit. The processor 811 may control data communication among the ECC block 820, the host interface 830, and the memory 840 through a bus 801.

The system 700 may be implemented as a USB memory drive or a memory stick.

Figure 17:
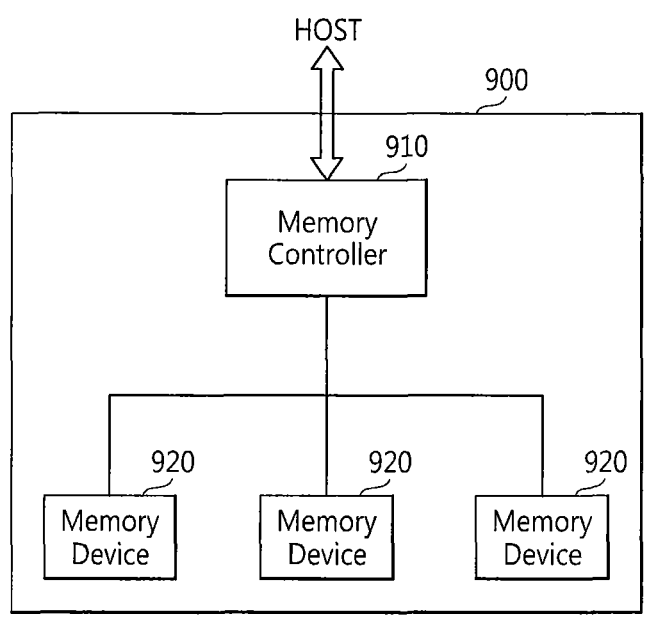
FIG. 17 is a block diagram of a system including a semiconductor memory device according to some aspects of the present disclosure.

FIG. 17 is a block diagram of a system 900 including the semiconductor memory device illustrated in FIG. 1A according to some aspects of the present disclosure. Referring to FIGS. 1A, 10, 11 and 17, the system 900 may be implemented as a data storage device. The system 900 may include a plurality of semiconductor memory devices 920, and a memory controller 910 which may control the data processing operations of each memory device. The system 900 may be implemented in memory modules.

Each of the plurality of semiconductor memory devices 920 may refer to the semiconductor memory device 100 shown in FIG. 1A.

Figure 18:
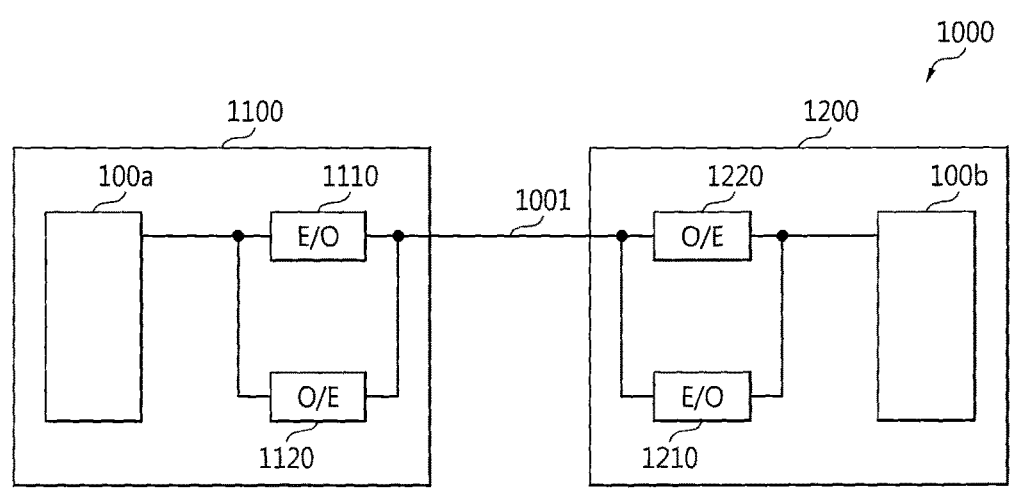
FIG. 18 is a block diagram of a system including a semiconductor memory device according to some aspects of the present disclosure.

FIG. 18 is a block diagram of a system 1000 including the semiconductor memory device according to some aspects of the present disclosure. Referring to FIG. 18, the system 1000 may include a first system 1100 and a second system 1200 which communicate data with each other through a channel 1001. The channel 1001 may be an optical connection means. The optical connection means may be an optical fiber, an optical waveguide, or a medium that transmits an optical signal.

Referring to FIGS. 1A and 18, the first system 1100 may include a first semiconductor memory device 100a and an electro-optic (E/O) conversion circuit 1110. The E/O conversion circuit 1110 may convert an electrical signal output from the first semiconductor memory device 100a into an optical signal and output the optical signal to the second system 1200 through the optical connection means 1001.

The second system 1200 may include an opto-electric (O/E) conversion circuit 1220 and a second semiconductor memory device 100b. The O/E conversion circuit 1220 may convert an optical signal input through the optical connection means 1001 into an electrical signal and transmit the electrical signal to the second semiconductor memory device 100b.

The first system 1100 may also include an O/E conversion circuit 1120 and the second system 1200 may also include an E/O conversion circuit 1210. When the second system 1200 transmit data to the first system 1100, the E/O conversion circuit 1210 may convert an electrical signal output from the second semiconductor memory device 100b into an optical signal and output the optical signal to the first system 1100 through the optical connection means 1001. The O/E conversion circuit 1120 may convert the optical signal received through the optical connection means 1001 into an electrical signal and transmit the electrical signal to the first semiconductor memory device 100a. The structure and the operations of the semiconductor memory devices 100a and 100b are substantially the same as those of the semiconductor memory device 100 illustrated in FIG. 1A.

As described above, according to some embodiments of the inventive concept, an OTP memory device write data to a plurality of OTP memory cells within a write time during which one of a plurality of word lines is activated, thereby reducing a total write time. Since the total write time is reduced, cost for testing the OTP memory device after being manufactured is reduced.

While inventive concepts described herein have been particularly shown and described with reference to exemplary embodiments thereof, it will be understood by those of ordinary skill in the art that various changes in forms and details may be made therein without departing from the spirit and scope of the inventive concept as defined by the following claims.

What is claimed is:

1. A one-time programmable (OTP) memory device comprising:

an OTP memory cell array comprising a plurality of dummy cells and a plurality of main cell groups, each of the main cell groups comprising a plurality of main cells; and an access circuit configured to write data to at least two of the main cells simultaneously, wherein each of the plurality of main cells are connected to a respective word line of a plurality of word lines and to a respective bit line of a plurality of bit lines; and wherein each of the main cells is writable and each of the dummy cells is unwritable, wherein ones of the word lines corresponding to each of the main cell groups are non-overlapping with ones of the word lines corresponding to other main cell groups of the plurality of main cell groups, wherein the bit lines corresponding to each of the main cell groups are non-overlapping with the bit lines corresponding to other main cell groups of the plurality of main cell groups, and wherein the main cell groups are diagonally placed on the OTP memory cell array.

2. The OTP memory device of claim 1, wherein each of the main cells comprises a contact layer, wherein each of the dummy cells does not comprise the contact layer, and wherein a supply voltage is applied to the OTP memory cell array through the contact layer.

3. The OTP memory device of claim 2, wherein the access circuit is configured to write data to a first main cell of the plurality of main cells in a first main cell group of the plurality of main cell groups while writing data to a second main cell of the plurality of main cells in a second main cell group of the plurality of main cell groups, the first main cell being different from the second main cell and the first main cell group being different from the second main cell group.

4. The OTP memory device of claim 3, wherein the access circuit is configured to simultaneously activate at least two of the word lines and at least two of the bit lines.

5. The OTP memory device of claim 1, wherein the access circuit comprises:
 a row driver configured to activate at least one of the word lines; and
 a column selector configured to select at least one of the bit lines,
 wherein the data is written to a main cell which is connected to the at least one activated word line and the at least one selected bit line.

6. The OTP memory device of claim 5, wherein each of the main cells and the dummy cells comprises a transistor and an antifuse circuit, and wherein the antifuse circuit comprises a gate oxide film.

7. The OTP memory device of claim 6, wherein a gate of the transistor is connected to one of the word lines, and wherein the transistor connects one of the bit lines with the antifuse circuit according to whether the one of the word lines is activated.

8. The OTP memory device of claim 6, wherein the gate oxide film is configured to break when the data is written to the main cell which is connected to the at least one activated word line and the at least one selected bit line.

9. The OTP memory device of claim 6, wherein the gate oxide film is configured to remain intact when a program voltage is applied to the dummy cell which is connected to the at least one activated word lines and the at least one selected bit line.

10. A one-time programmable (OTP) memory device comprising:

an OTP memory cell array comprising a plurality of OTP memory cells each of which is connected to one of a plurality of word lines and one of a plurality of bit lines; and an access circuit comprising a row driver configured to activate at least two of the word lines, and a column selector configured to select at least two of the bit lines, wherein the access circuit is configured to sequentially write a plurality of data to at least two of the OTP memory cells during a write time, wherein the write time is a duration during which at least one of the word lines is activated, wherein the plurality of data are sequentially written to the at least two OTP memory cells which are connected to the at least two of the word lines that are activated and the at least two of the bit lines that are selected.

11. The OTP memory device of claim 10, wherein the column selector comprises a plurality of switching circuits, each of the switching circuits detects a current flowing in a bit line connected to each switching circuit, and each switching circuit cuts off the current flowing in the bit line when the current flows in the bit line.

12. The OTP memory device of claim 11, wherein each of the switching circuits comprises:
 a current detector configured to detect the current flowing in the bit line and to output a switch signal; and
 a switch configured to control the current flowing in the bit line according to the switch signal received from the current detector.

13. The OTP memory device of claim 12, wherein the switch comprises a transistor and the current detector comprises an operational amplifier.

14. A one-time programmable (OTP) memory device comprising:
 an OTP memory cell array comprising a first main cell group and a second main cell group, each comprising at least one main cell, each of the at least one main cells connected to one of a plurality of word lines and one of a plurality of bit lines; and
 an access circuit configured to simultaneously write a plurality of data to at least two of the main cells during a write time by activating at least two word lines of the plurality of word lines and selecting at least two of the plurality of bit lines,
 wherein the OTP memory cell array comprises a third main cell group and a fourth main cell group, each comprising at least one main cell, each of which is connected to one of the plurality of word lines and one of the plurality of bit lines, and
 wherein the access circuit is configured to simultaneously write the plurality of data to at least four of the main cells during the write time by activating at least four word lines of the plurality of word lines and selecting at least four of the bit lines of the plurality of bit lines.

15. The OTP memory device of claim 14, wherein the OTP memory cell array comprises at least one unwriteable dummy cell.

16. The OTP memory device of claim 15, wherein each of the at least one main cells of the first main cell group and the second main cell group comprises a contact layer, wherein the at least one unwriteable dummy cell does not comprise the contact layer, and the OTP memory device is configured to apply a supply voltage to the OTP memory cell array through the contact layer.

17. The OTP memory device of claim 14, wherein each of the at least one main cells of the first main cell group and the second main cell group comprises an antifuse.

\* \* \* \* \*